United States Patent [19]

Vasa

[11] 4,128,892
[45] Dec. 5, 1978

[54] PULSE WIDTH MEASUREMENT CIRCUITRY

[75] Inventor: Suresh L. Vasa, Sunnyvale, Calif.

[73] Assignee: Fairchild Camera and Instrument Corporation, Mountain View, Calif.

[21] Appl. No.: 831,306

[22] Filed: Sep. 7, 1977

[51] Int. Cl.² .................. G06F 7/38; G06F 9/18; G04F 10/00
[52] U.S. Cl. .................. 364/900; 364/569; 235/92 T; 324/181

[58] Field of Search ... 364/200 MS File, 900 MS File, 364/705, 569; 235/92 T, 92 TF; 307/293; 328/129; 324/181

Primary Examiner—James D. Thomas
Attorney, Agent, or Firm—Alan H. MacPherson

[57] ABSTRACT

An external pulse width measuring circuit for use in a microprocessor system counts and stores the number of clock signals occurring in either a positive or negative going pulse. Short pulses may be measured to a 1 microsecond accuracy and the circuitry is capable of measuring very long pulses by the use of a counting prescaler and the ability of the timer to continue counting the prescaled pulses after reaching its full normal capacity.

7 Claims, 4 Drawing Figures

PULSE WIDTH MEASUREMENT CIRCUITRY

SUMMARY OF THE INVENTION

It is often desirable to incorporate with a microprocessor system a provision for the accurate measurement of the length of an electrical pulse. This is most effectively accomplished by counting the number of timing pulses of known duration, such as system clock pulses; that will occur between the leading and lagging edges of the pulse being measured. The clock signal counter has a count limitation, generally 8 bits or 256 counts, so that the counter operating with system clock signals of 1 MHz may measure a pulse having a width up to 256 microseconds at an accuracy of 1 microsecond. By scaling down the system clock so that the counter may, for example, count each 256th clock signal, the counter may measure pulses having widths up to 16 milliseconds with an accuracy of 256 microseconds.

The pulse width measuring circuitry of the present invention is intended to be included in a microprocessor system, such as that described and claimed in U.S. Pat. 3,984,813, issued Oct. 5, 1976 and assigned to the assignee of the present invention. An external pulse signal to be measured is applied to the external interrupt terminal of the microprocessor and is transmitted to the circuitry of the invention for measurement by counting the number of system clock pulses between transitions of either polarity of the pulse signal.

The pulse counter or timing circuit of the invention is controlled by the system software program that preloads a control register that supplies prescaler or count rate and other data to a control circuit that generates the necessary control signals for a prescaler circuit and for the timer. When the timer, which is counting the prescaled clock signals, is stopped by the end-of-pulse transition, its count is held for transmission through the data bus to the processor, and an interrupt request signal is generated and transmitted to the processor. Thus, although the pulse measuring circuitry is a component part of the microprocessing system, its ability to signal the completion of its routine makes it appear to the microprocessor as a peripheral device coupled to an input/output port.

The circuitry of the invention permits the measurement of very long pulses by permitting the counter to count through its maximum capacity, at which point the timer interrupt signal will be generated when the timer counter crosses "0". The microprocessor will use this interrupt request to increment a counter which will keep a count of the number of times the timer reaches its capacity and re-starts. At the end of the pulse, the timer stops counting and provides an interrupt signal indicating the end of the pulse. The processor system can then add the remaining count to the total gathered during the recycling of the timer to produce an accurate measurement of the pulse width. If the very high accuracy is desired, the prescaler may be set to a low value so that long pulses may be measured to an accuracy of approximately 1 microsecond.

DESCRIPTION OF THE DRAWINGS

In the drawings which illustrate a preferred embodiment of the invention.

DETAILED DESCRIPTION

Figure 1:
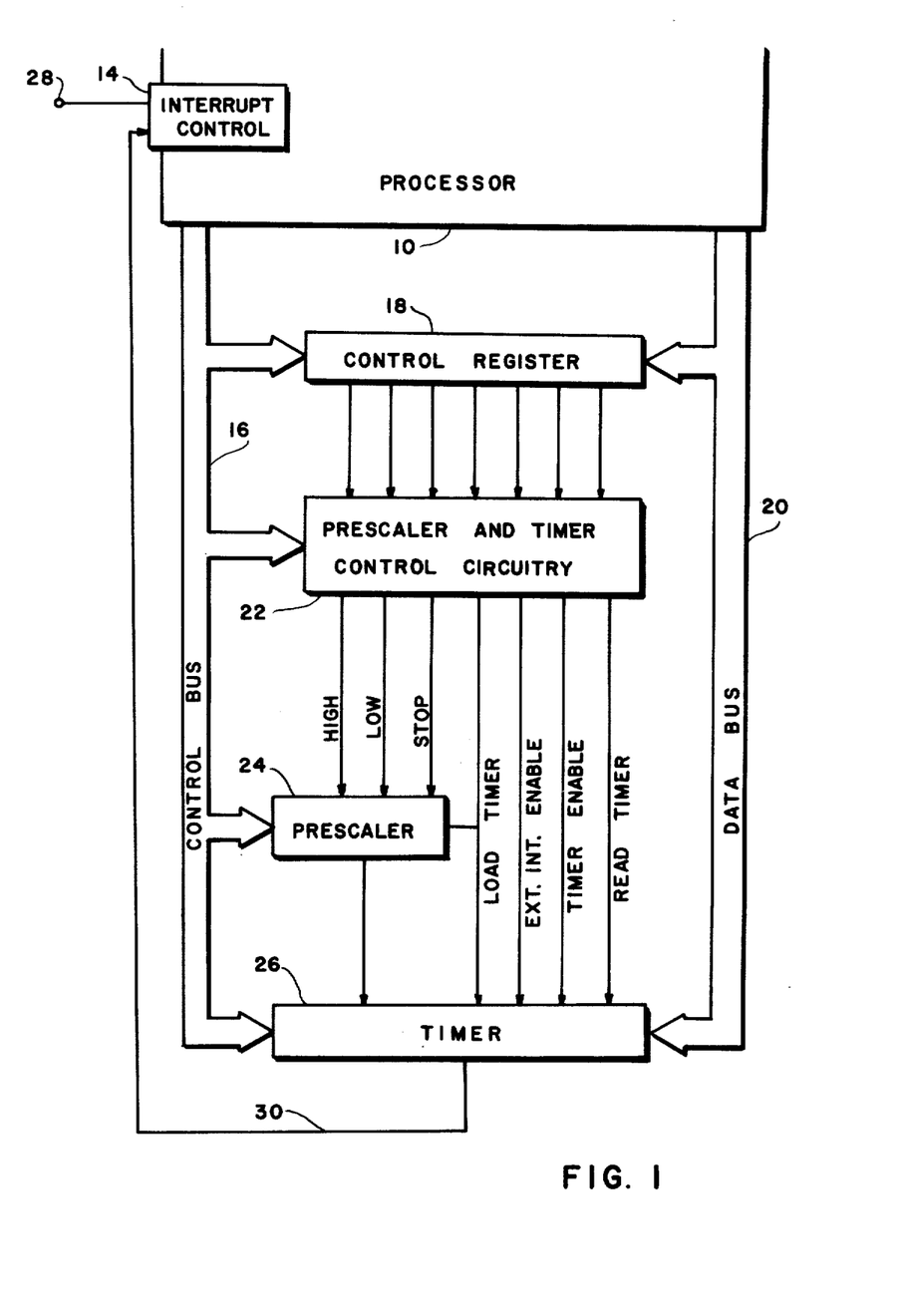
FIG. 1 is a block diagram illustrating the pulse width measuring circuitry of the invention in a microprocessor system.

Referring now to the drawings, FIG. 1 is a block diagram depicting a microprocessor 10, such as that described in U.S. Pat. No. 3,984,813. Microprocessor 10 includes an interrupt control circuit 14 which, upon appropriate request signals, will interrupt the normal program operation when data is to be accepted from or supplied to the peripheral devices. The microprocessor 10 is also provided with control circuitry that generates all the necessary control and timing signals for operating both the microprocessor and, via a control and timing bus 16, the system's peripheral circuits such as the pulse width measuring circuit of the present invention.

The circuitry of the present invention includes a 7-bit control register 18 which, as will be subsequently described, is loaded by the microprocessor system software through the system data bus 20 with binary data defining the various modes of operation of the measuring circuitry. Upon the appropriate control signal by control bus 16, the contents of the register 18 are transferred through data bus 20 to a prescaler and timer control circuitry which develops the various signals for controlling prescaler 24 and timer 26.

Prescaler 24, which receives a 2 MHz clock signal from the microprocessor 10, also receives from the control circuitry 22 suitable signals which enable the prescaler 24 to generate output counting signals to the timer 26 that are ½, ¼, 1/32, or 1/128 the frequency of the 2 MHz clock.

Control circuitry 22 also generates signals that are transmitted to the timer 26 that will load the timer through data bus 20 with any count preselected by the processor system software program. Control circuitry 22 also provides the timer with signals that will enable the timer, and with a read signal that causes the total stored in the timer to be transmitted back through data bus 20 into the microprocessor 10.

The control circuitry 22 receives its control data from the processor software program via the 7-bit control register 18. The first two bits in the 7-bit control register 18 are designated as interrupt control bits and are combined in the control circuitry 22 to generate control signals for loading, reading and enabling the timer 26 and for enabling the interrupt circuit which is triggered by the timer 26 upon completion of its count. The third and fourth bits of the control register 18 are designated as prescaler control bits and are gated with appropriate clock pulses within the control circuitry 22 to generate output signals that will enable the prescaler to select one of four different count rates for the timer 26. The fifth bit of the control register 18 is a timer start/stop bit which is gated with suitable timing signals in the control circuitry 22 and also with the external pulse to be measured, to start and stop the action of the prescaler 24 and hence the timer 26. The sixth bit of the control register 18 is an edge polarity bit which is combined within the control circuitry with suitable timing signals and with the timer start/stop signal to direct whether the falling or rising transition of the pulse will be active. The seventh bit of the control register 18 indicates whether the external pulse width measurement circuitry is functioning or inactive.

In operation, an external signal bearing the pulse to be measured is applied to the external interrupt input terminal 28 and the interrupt control 14 of the microprocessor system 10. Upon receipt of the signal, the control register 18 will be loaded through data bus 20 in accordance with the microprocessor software program and the data stored within the register will be applied to the prescaler and timer control circuitry 22. In accordance with the instructions of the control register 18, the control circuitry 22 will generate timed signals that will select an appropriate prescaler count and will load the timer 26 through data bus 20 with a predetermined count between 0–255. The microprocessor 10 will thereupon transmit the pulse to be measured via a signal through the control and timing bus 16 to the control circuitry 22 which will generate a signal that starts prescaler 24 generating output count rate pulses at the predetermined rate. The count rate pulses are applied to timer 26 where they operate as internal clock pulses for advancing an 8-bit binary counter. The timer 26 continues to count until the end-of-pulse transition is received by the timer control circuitry 22 and then generates a stop signal to the prescaler 24. Prescaler 24 thereupon stops producing clocking pulses for the timer 26 and the timer stops further operation and awaits a suitable read signal from the control circuitry 22 to transfer its stored data through the data bus 20 and to the microprocessor.

Timer 26 includes an 8-bit binary counter that is clocked by the prescaled output count pulses from prescaler 24. If the external pulse to be measured is sufficiently wide so that the counter in timer 26 counts through its full capacity and continues, the passing through the counter's "0" point will generate an interrupt request signal to the microprocessor unit 10. The microprocessor will, under separate control, count the "0" crossings and add them to the final count contained in the timer 26 when the clocking pulses generated by the prescaler are stopped by the control circuitry upon the sensing of the end-of-pulse transition of the external pulse.

TIMER AND CONTROL CIRCUITRY 22

Figure 2:
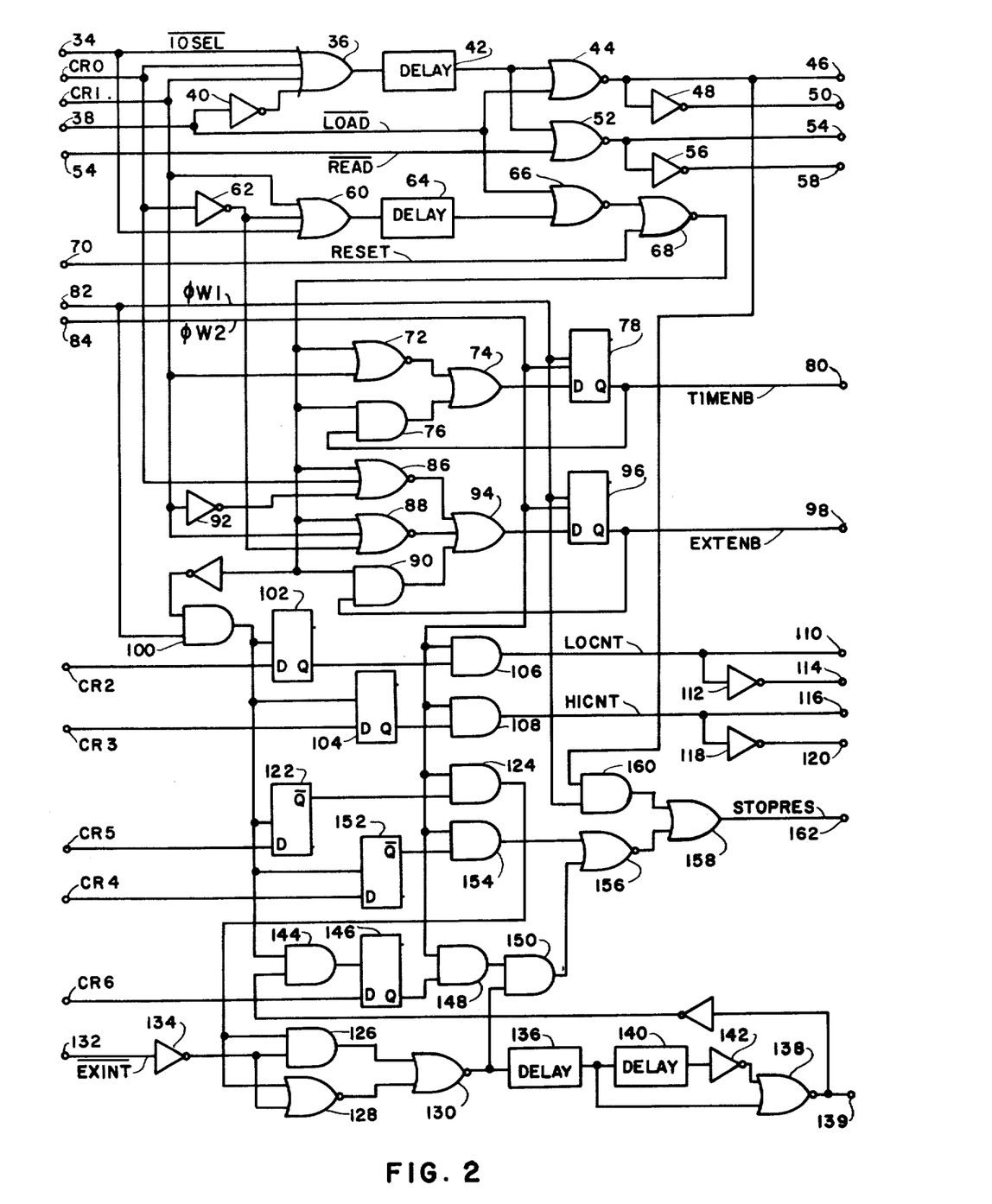
FIG. 2 is a logic diagram of the prescaler and timer control circuitry of the invention.

FIG. 2 is a logic diagram of the prescaler and timer control circuitry 22 of FIG. 1. Input terminals to the control circuitry of FIG. 2 are on the left side of the figure and include input terminals CR0 through CR6 which designate inputs that are received, via the data bus 20 from bits zero through six of the 7-bit control register 18 of FIG. 1. Inputs CR0 and CR1 are respectively coupled to the first two bits in the control register 18 and are designated as interrupt control bits. If the signals appearing in terminals CR0 and CR1 are both high, the output signal will interrupt only the timer. If CR0 is high and CR1 is low, external interrupt is selected; and if CR0 is low and CR1 is high, the circuitry will cause both an external and timer interrupt. An input/output select signal from the central processing unit is applied to the input terminal 34 and is applied to the input of a 4-input OR-gate 36 along with the signals applied through terminals CR0, CR1 and also a LOAD signal applied from the central processor to terminal 38 and inverted by inverter 40. The output of OR-gate 36 is applied through a "one-write" delay 42 to the first input terminal of a NOR-gate 44, the second input of which is connected directly to the input terminal 38. The output of NOR-gate 44 is connected to an output terminal 46 and also through an inverter 48 to a second output terminal 50. When inverted values are applied to input terminals 34, CR0 and CR1, a negative LOAD signal applied from the processor to input terminal 38 will result in a "load timer" output pulse at terminal 46. This signal will be used in the timing circuit of FIG. 4 for pre-loading its counter to a predetermined value, as will be later explained.

The output of the delay 42 is also applied to a NOR-gate 52, the second input of which receives a central processor generated READ signal at an input terminal 54. The output of NOR-gate 52 is coupled to an output terminal 54 and through an inverter 56 to an output terminal 58. An inverted READ signal applied to input terminal 54 will, during the same interrupt generated through OR-gate and delay 42, produce a "read-timer" signal at terminal 54 that will be used in the timer circuit of FIG. 4 for transmitting the number in the counter to the system data bus multiplexer.

Input terminals 34 and CR1 are also coupled to an OR-gate 60, the third input terminal of which is coupled to terminal CR0 through an inverter 62. Since the first bit of the control register 18 has been inverted by the inverter 62, the output of OR-gate 60 now designates a selection of both external and timer interrupt, and this signal is applied through a "one-write" delay 64 to the input of NOR-gate 66, the second input terminal of which receives a LOAD signal from input terminal 38. The output of NOR-gate 66 is applied to the input of NOR-gate 68, the second input of which is a RESET signal generated by the central processor and applied to the input terminal 70. The output of NOR-gate 68 may be designated as a "load local interrupt" signal and, when in its true state, functions to enable the gating from the interrupt control register 18 into the control circuitry of FIG. 2.

The local interrupt signal from NOR-gate 68 is applied to one input of a NOR-gate 72, the second input of which is connected to terminal CR1. The output of NOR-gate 72 is applied to an OR-gate 74, the second input of which is received from AND-gate 76. The output of OR-gate 74 is applied to the D input of a flip-flop 78, the true output of which is applied to output terminal 80 and also back as one input to the AND-gate 76, the second input of which receives the local interrupt signal from NOR-gate 68. A low input from NOR-gate 68 and from terminal CR1 generates an output that is applied to the flip-flop 78 which is clocked to the output terminal upon the occurrence of a 0W2 signal generated by the central processor, and with a 0W1 signal, is applied to the clock input terminals 82 and 84. The output signal appearing at the terminal 80 is applied to the timer of FIG. 4 to signal that the timer function is enabled.

The load local interrupt signal from the NOR-gate 68 is also applied to NOR-gates 86, 88 and AND-gate 90. NOR-gate 86 receives a second input from the CR0 terminal and a third input through an inverter 92 from the CR1 terminal. NOR-gate 88 receives a second input from CR1 terminal and a third input from the output of inverter 62 coupled to the CR0 terminal. The outputs of NOR-gates 86 and 88 and the AND-gate 90 are coupled to an OR-gate 94, the output of which is connected to the D input of a flip-flop 96, the true output of which is connected to the output terminal 98 and also to the second input terminal of the AND-gate 90. Appropriate negative-going input signals to the NOR-gates 86 and 88 select an external interrupt function and, when clocked by the flip-flop 96, produces a signal at terminal 98 that will be applied to the timer circuitry of FIG. 4 for enabling the external interrupt.

Input terminals CR2 and CR3 introduce into the circuitry the data contained in the third and fourth bits of the control circuitry 22. The third and fourth bits determine the count rate developed by the prescaler circuitry of FIG. 3 as follows: If both bits are positive, the prescaler pulses every other clock frequency; if both are negative, one pulse is generated for each 32 clock pulses; if the signals applied to CR2 and CR3 are respectively "0" and "1", the prescaler will divide by "8" and if they are respectively "1" and "0", the prescaler will divide by "182".

The output of NOR-gate 68 is inverted and applied to one input of AND-gate 100, the other input being coupled to receive the 01 clock pulse from terminal 82. The output of gate 100 therefore produces a new clock signal that is applied to D flip-flops 102 and 104. Terminal CR2 is coupled to the D input of flip-flop 102 and the CR3 input terminal is coupled to the D terminal of flip-flop 104. The true output of flip-flop 102 is connected to one input of a NAND-gate 106 while the true output of flip-flop 104 is connected to AND-gate 108. The second input terminals of gates 106 and 108 are connected together and to the 02 clock signal to input terminal 84. The output of AND-gate 106, arbitrarily designated as "low count", is applied to the output terminal 110 and through an inverter 112 to the output terminal 114. The output of AND-gate 108 is designated as "high count" and is applied to the output terminal 116 and through an inverter 118 to the output terminal 120. The signals appearing on terminals 110, 114, 116 and 120 are applied to the prescaler circuitry of FIG. 3, as will be subsequently described.

Input terminal CR5 is coupled to receive an input from the control register that indicates the polarity of the external pulse to be measured; that is, a binary "0" will designate that the falling edge of the pulse is active while a binary "1" will indicate that the rising edge of the pulse is active. Input terminal CR5 is coupled to the D input of a flip-flop 122 which is clocked by the output of AND-gate 100. The false output of flip-flop 122 is applied to AND-gate 124, the other input of which receives a 02 pulse from terminal 84. The output of AND-gate 124 is applied to the input of an exclusive-OR circuit comprising AND-gate 126, NOR-gate 128, followed by NOR-gate 130. The second input to the exclusive-OR circuit is the external pulse to be measured, which is transmitted by the microprocessor in inverted form to the input terminal 132 where it is inverted by the inverter 134 and applied to the exclusive-OR circuit. The output of the NOR-gate 130 is applied through a "one-write" delay 136 to one input of NOR-gate 138 and is also applied through a second delay 140 and an inverter 142 to the second input of the NOR-gate 138.

The output of NOR-gate 138 is connected to an output terminal 139 and is also inverted and applied back to AND-gate 144 which receives another input from the clocking output of AND-gate 100. The output of AND-gate 144 is coupled to the "clock" input terminal of a D flip-flop 146.

Input terminal CR6 receives a signal from the seventh bit of the control register that indicates whether a pulse measurement is to be made. A binary "0" appearing at input terminal CR6 has no special function while a binary "1" designates that the pulse width measurement is to be made. Terminal CR6 is coupled to the D input of flip-flop 146, the true output of which is applied to AND-gate 148, the other input of which is the 02 signal applied to input terminal 84. The output of AND-gate 148 is applied to the input of an AND-gate 150, the other input of which is derived from the output of the NOR-gate 130 in the exclusive-OR circuit.

Input terminal CR4 is coupled to the fifth bit in the control register and receives a signal in which a binary "0" indicates that the timer counter is to be running and the binary "1" indicates that the timer counter is to be stopped. Input terminal CR4 is connected to the D input of a flip-flop 152 which is clocked by the output of AND-gate 100. The false output of flip-flop 152 is coupled to AND-gate 154, the other input of which is the 02 signal applied to terminal 84. The output of AND-gate 154 is applied to one input terminal of a NOR-gate 156, while the output of AND-gate 150 is applied to the other input terminal of the NOR-gate 156. The output of NOR-gate 156 is applied to the input of OR-gate 158, a second input of which is derived from the output of AND-gate 160 which receives inputs from the 01 signal applied to input terminal 82 and the "load timer" signal appearing at output terminal 46. The output of OR-gate 158 produces a STOP PRESCALER signal that controls the operation of the prescaler of FIG. 3.

In operation, the signal representing the selected active edge of the pulse to be measured is applied to terminal CR5, the resulting clocked output being applied to the exclusive-OR circuit along with the external pulse. The resulting output is applied to a NOR-gate 156 where it is mixed with the prescaler enabling signal. When the leading edge of the pulse to be measured is applied to the input terminal 132 and is enabled by a positive signal on the input terminal CR6, the AND-gate 150 will produce a binary "1" output which will drive the output of NOR-gate 156 to the low state to produce a low output at terminal 162, thereby enabling the prescaler counter. An end-of-pulse signal at terminal 132 will likewise produce a binary "0" input to the NOR-gate 156 that will generate a positive output that will stop the operation of the prescaler as will now be described.

PRESCALER 24

Figure 3:
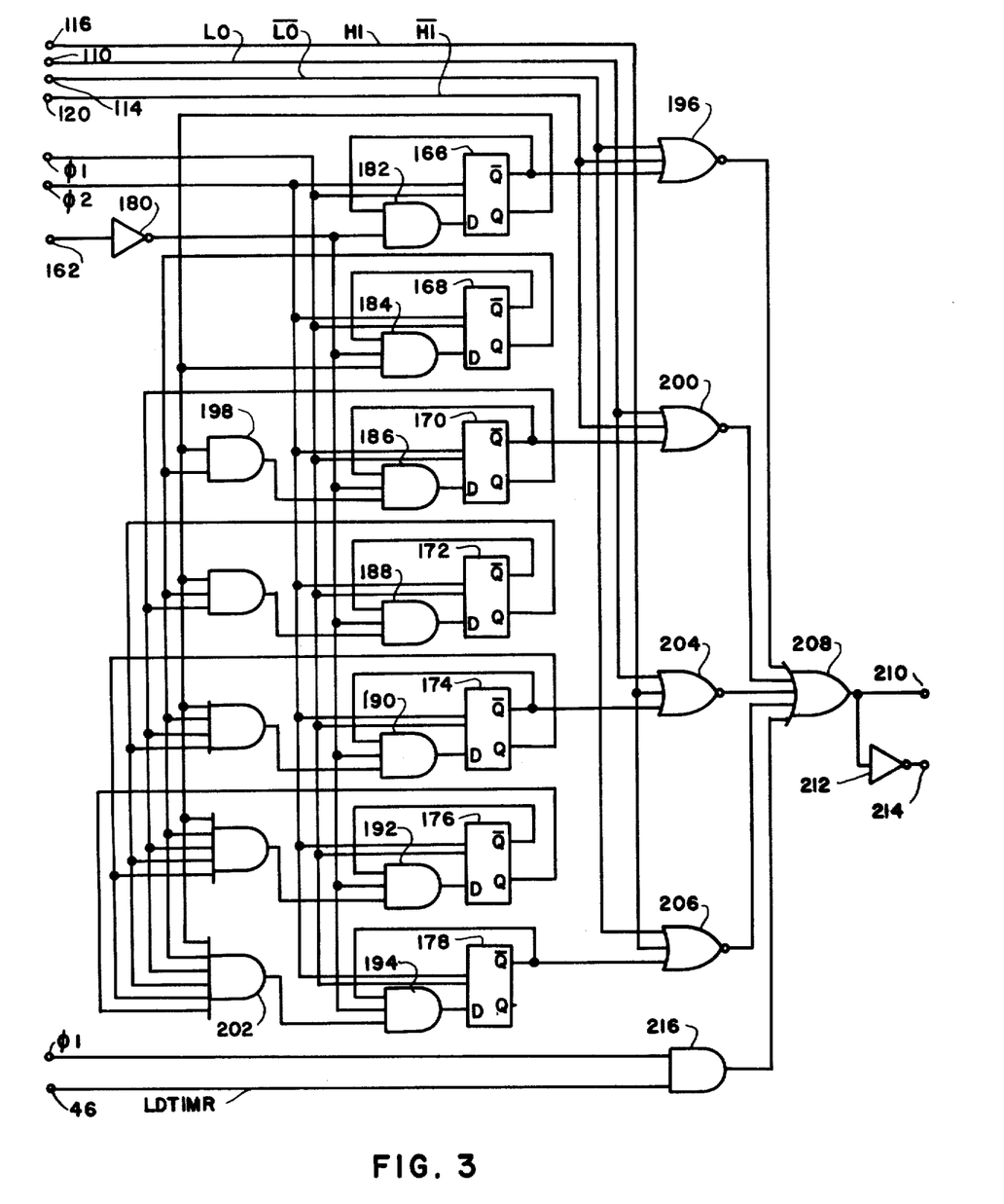
FIG. 3 is a logic diagram of the prescaler.

FIG. 3 is a logic diagram of the prescaler of the invention. The prescaler is essentially a counter that advances one binary count upon the occurrence of each clocking pulse provided there is no inhibiting signal present. As shown in FIG. 3, 01 and 02 inputs are applied to each clock input of seven D-type flip-flops 166–178. Input terminal 162 is connected to the output terminal 162 of FIG. 2 and receives an inverted enabling signal generated by the presence of the external pulse. The negative signal is inverted by the inverter 180 and applied as one input to each of the AND-gates 182 and 194, the outputs of which are applied to the "D" inputs of the flip-flops 166–178, respectively. The false output of flip-flops 166 is applied as the second input to AND-gate 182 and is also applied to the NOR-gate 196. Thus, as long as inverter 180 produces a true output, the flip-flop 166 will switch states upon the occurrence of each input clock pulse.

The false output of flip-flop 168 is also applied back as one input to AND-gate 184, the output of which is coupled into the "D" input of that flip-flop. AND-gate 184 also receives the third input from the true output of the next lower significant flip-flop 166 so that the flip-flop 168 can change state only upon the occurrence of a true output from the next preceding flip-flop 166, or at half the counting rate of flip-flop 166.

AND-gate 186, which provides the input to flip-flop 170, receives inputs from the false output of the flip-flop 170, the output of inverter 180, and the output of AND-gate 198 which receives its inputs from the true output terminals of flip-flops 166 and 168. Therefrom, flip-flop 170 can only change states while its true output is low and while all lower order flip-flop true outputs are high, or at one-half the rate of flip-flop 168 and one-quarter of the switching rate of flip-flop 166. The false output of flip-flop 170 is applied as one input to the NOR-gate 200.

The counter continues on through seven stages so that the highest significant flip-flop 178 can change states when AND-gate 194 receives a binary "1" from the false output of flip-flop 178, a true output from the inverter 180, and a true output of the AND-gate 202. AND-gate 202 is a 6-input AND-gate and is coupled to each of the true outputs of all the lower order flip-flops 166–176. Therefore, flip-flop 178 can switch states only when the true outputs of all the lower order flip-flops are at the binary "1", the true output of flip-flop 178 is a binary "0", and there is no positive inhibiting signal applied to the input terminal 162.

The false output of flip-flop 166 is applied to one input terminal of the three-input NOR-gate 196; the false output of flip-flop 170 is applied to one input terminal of the three-input NOR-gate 200; the false output of flip-flop 174 is applied to one input of the three-input NOR-gate 204, and the false output of the highest order flip-flop 178 is applied to a three-input NOR-gate 206. The output terminals of NOR-gates 196, 200, 204 and 206 are applied to an OR-gate 208, the output of which is coupled to a terminal 210 and through an inverter 212 to an output terminal 214. A fifth input to the OR-gate 208 is derived from the output of an AND-gate 216 which receives, as its inputs, a 01 clocking signal and a "load timer" signal from output terminal 46 of the control circuitry of FIG. 2.

The "low count" and "high count" signals generated by the control circuitry of FIG. 2 and applied to the terminals 110, 114, 116 and 120, are transmitted into the prescaler circuitry of FIG. 3 by similarly identified input terminals and are used to select which one of the NOR-gates 196, 200, 204 and 206 will produce an output signal representing a prescale count 2, 8, 32, and 128, respectively. Thus, the low count signal applied to terminal 110 also provides the input to NOR-gates 200 and 204. The inverted low value applied to input terminal 114 provides an input to NOR-gates 196 and 206. The "high count" signal applied to input terminals 116 provides inputs to NOR-gates 204 and 206, while its inverted value applied to input terminal 120 provides inputs to NOR-gates 196 and 200. Therefore, selected input combinations that are initially derived from input terminals CR2 and CR3 of FIG. 2 will select only one of the NOR-gates 196, 200, 204 or 206 to produce an output representing a selected count rate that is applied to the output terminals 210 and 214 and as clocking pulses for the timer circuitry of FIG. 4, as will now be explained.

TIMER 26

Figure 4:
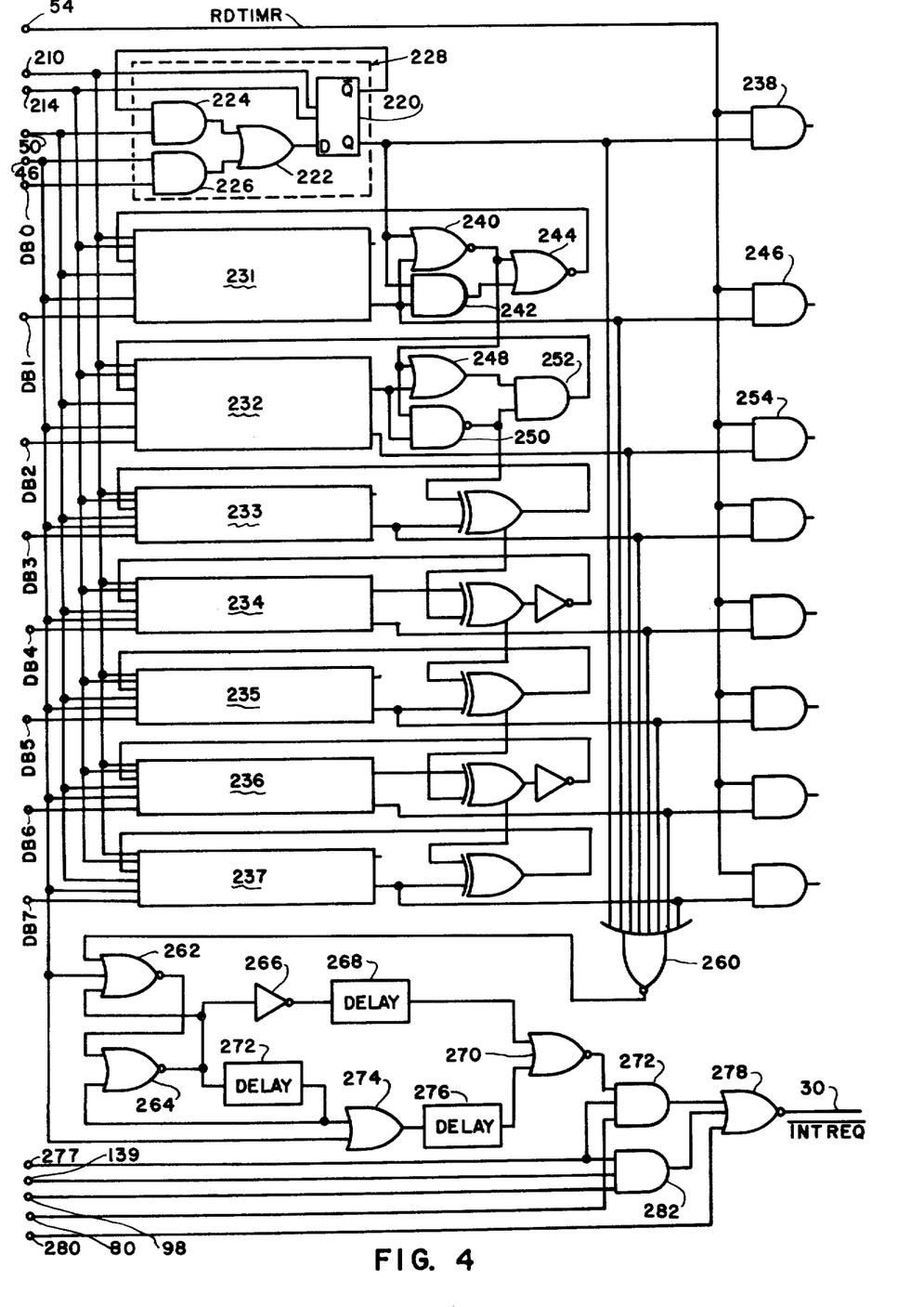
FIG. 4 is a logic diagram illustrating the timer of the invention.

FIG. 4 is a logic diagram of the timer which comprises an 8-bit binary counter and circuitry for generating signals representing a timer interrupt request whenever the counter passes through a "0" count and an external interrupt request when the timer has been stopped by the end-of-pulse transition.

Clocking pulses for the timer of FIG. 4 enter the circuitry at input terminals 210 and 214 and are the selected prescaler pulses generated at output terminals 210 and 214 of FIG. 3. As shown in FIG. 4, terminals 210 and 214 are are coupled to a D-type flip-flop 220. The input for flip-flop 220 is derived from an OR-gate 222 which, to switch the flip-flop, must receive positive input signals from either one of two AND-gates 224 or 226. As illustrated in the drawing of FIG. 4, flip-flop 220, OR-gate 222, and AND-gates 224 and 226 are enclosed in a dashed box designated by the reference numeral 228. The components contained in box 228 are duplicated throughout the remaining seven bits in the counter; that is, the components within boxes 231–237 are identical with those contained in the dashed box 228.

AND-gate 224 receives one input from the false output of flip-flop 220. The second input to the AND-gate is a binary "1" indicating the absence of the "load timer" signal generated at the output terminal 50 of the prescaler and timer control circuitry of FIG. 2. The AND-gate 226, on the other hand, is coupled to receive a "load timer" signal from the output terminal 46 of FIG. 2 and is also coupled to the data bus through input terminal DB0. As previously indicated, the microprocessor has the capability of pre-loading the timer to any preselected value between "0" and "225". This is accomplished by transmitting the desired count through the 8-line data bus from the central processor to the input terminals DB0-DB7 in the timer of FIG. 4. Thus, upon the occurrence of a positive "load timer" signal on input terminal 46, the AND-gate 224 will be disabled and the AND-gate 226 and all other similar AND-gates in the higher order boxes will be enabled to admit the particular binary count applied to the terminals DB0-DB7.

During normal counting operations, AND-gate 224 and the identical AND-gates in the higher order boxes 231–237 will receive a positive signal indicating the absence of a "load timer" signal. AND-gate 224 in the dashed box 228 also receives an input signal from the false output of the flip-flop 220 so the flip-flop 220 will switch states upon the occurrence of each prescaled clock pulse. The output of this lowest order counter element is taken from the true output terminal of the flip-flop 220 and applied as one input to the AND-gate 238.

The second order counter element contained within the box 231 is identical with the components contained within the dashed box 228. The flip-flop in the box 231 is switched by the clock pulses received on terminals 210 and 214 and responds to an input signal at its "D" terminal from an AND-gate that receives one input from input terminal 50. The second input to the AND-gate in box 231 is received from the output of an exclusive-OR circuit comprising NOR-gate 240, AND-gate 242 and NOR-gate 244. NOR-gate 240 and AND-gate 242 receive one input from the true output of flip-flop 220 in the lowest order box 228, and a second input from the true output of the flip-flop within the box 231. The output terminals of gates 240 and 242 are applied to the input terminal of the NOR-gate 244, the output of which is applied back into the input AND-gate in box 231. The output signal from the second order counter element is taken from the true output of the flip-flop in box 231 and is applied to the AND-gate 246.

The next higher order counting element is identical except that its input AND-gate within the box 232 receives the output of an exclusive-NOR circuit comprising OR-gate 248, NAND-gate 250, and AND-gate 252. The OR-gate 248 and the NAND-gate 250 receive input signals from the false output of the flip-flop within box 231 and from the output of the NOR-gate 240 associated with the second order counter element. The outputs of gates 248 and 250 are applied as inputs to the AND-gate, 252. The output of the third order counter is taken from the true output terminal of the flip-flop within box 232 and is applied to the AND-gate 254.

The remaining higher order counters are identical with the previously described lower order counters with exclusive-OR gates associated with the boxes 233, 235 and 237, and exclusive-NOR circuits associated with the boxes 234 and 236. The outputs of each counter element is taken from the true output terminal of the respective flip-flops and applied to output AND-gates, such as gates 238, 246 and 254. The second inputs to those AND-gates are coupled to receive a "read timer" signal generated by the control circuitry of FIG. 2 and applied to the terminal 54. Therefore, a positive going signal at terminal 54 will enable all of the output AND-gates, such as gates 238, 246 and 254. The output terminals of these gates are coupled back into the 8-line data bus so that the content of the counter may be transmitted to the central processor.

Each of the output terminals of the eight counter elements are also coupled to the input of an 8-input NOR-gate 260 which will generate a binary "1" output whenever all of the eight counter elements produce a "0" output. The output of NOR-gate 260 is applied to one output terminal of an SR-latch comprised of cross-coupled NOR-gates 262 and 264. NOR-gate 262 is also coupled to receive a "load timer" signal from input terminal 46 so that, except during the time the timer is being pre-loaded by the central processor, a pulse output from NOR-gate 260 will cause the latch circuit to produce a positive output from the NOR-gate 264.

The output of NOR-gate 264 is applied through an inverter 266 to a "one-write" delay 268, the output of which is applied to a NOR-gate 270. The output of NOR-gate 264 is also applied to a similar delay 272, the output of which provides a latch reset input to the NOR-gate 264. The output of the delay 272 is also applied through an OR-gate 274, and a second similar delay 276 to the second input of the NOR-gate 270. The two-branch delay network produces at the output of NOR-gate 270 a single pulse that indicates that the counter has completed a full cycle and has passed through "0" count. This pulse is applied at its one input of a 3-input AND-gate 272.

AND-gate 272 receives a second input signal from terminal 277 which is connected to the central processor via the control bus 116. The signal to terminal 277 is designated as the "freeze" signal which, when in its low state, will freeze all interrupt circuits associated with the microprocessor system. The third input to the AND-gate 272 is the "time enable" input generated by the control circuitry of FIG. 2 and received on terminal 80. This signal is in its high state whenever the timer function is enabled. Therefore, in the absence of the "freeze" signal and during the period that the timer function is enabled, the pulse from AND-gate 272 will be ANDed to produce a true output which is applied as one input to a 3-input NOR-gate 278. The output of NOR-gate 278 is connected to the "interrupt request" conductor 30 that returns to the interrupt control section 14 of the microprocessor unit 10, as illustrated in FIG. 1. The signal appearing on conductor 30 is normally high and the interrupt request is a negative going pulse generated in the NOR-gate 278 by any one of three high input signals such as that produced at the output of AND-gate 272, as previously described, or by the application of the positive-going "service request" signal or a "priority interrupt" signal that may be transmitted to the timer circuit through the control bus 16 to the input terminal 280.

A third input to the NOR-gate 278 that may generate an interrupt request to the microprocessor is derived from the 3-input AND-gate 282. AND-gate 282 receives its first input from terminal 277 which, as previously described, carries a "freeze" signal that goes to a low state if interrupt networks are to be frozen. A second input to the AND-gate 282 is received from input terminal 139 which is generated by the control circuitry of FIG. 2 and remains in its high state during the presence of a pulse to be measured. The third input AND-gate 282 is received from terminal 98 which carries an external interrupt enabling signal generated by the control circuitry of FIG. 2 as previously described. Therefore, in operation, an interrupt request signal will be generated on the conductor 30 whenever the counter in the timer of FIG. 4 crosses "0" count or whenever the control circuitry of FIG. 2 detects an end-of-pulse transition of the pulse to be measured, provided however, that all enabling signals are present and no inhibiting signals, such as "freeze", are present.

Having thus described my invention, what is claimed is:

1. External pulse width measuring circuitry for use in a microprocessor system including a microprocessor unit, a data bus for transferring data between said microprocessor and said measuring circuitry, a control bus for transmitting control signals and system clock signals to said measuring circuitry, an interrupt control circuit for receiving interrupt signals generated external of said microprocessor unit, and a counter circuit, said pulse width measuring circuitry comprising:

a control register coupled to the data bus and the control bus for receiving external pulse measurement instruction data from the microprocessor;

prescaler and timer control circuitry coupled to said control register and said control bus for generating from said instruction data, the control signals, and the system clock signals, a plurality of output signals for controlling the operation of the pulse width measuring circuitry;

a prescaler coupled to said control circuitry and said control bus for generating counting pulses from said system clock signals and at a frequency controlled by said control circuitry, the generation of said counting pulses being enabled or inhibited by said control circuitry output signals representing the leading edge and end-of-pulse transitions, respectively, of said external pulse; and     timing circuitry coupled to said prescaler, said control circuitry, said data bus, said control bus, and to the microprocessor interrupt control circuit for counting said counting pulses, storing said count, transferring said count to said data bus upon receipt of a particular first output signal from said control circuitry, and for producing and transmitting to said microprocessor interrupt control circuit an external interrupt request signal upon the occurrence of an end-of-pulse transition of said external pulse.

2. The external pulse width measuring circuitry claimed in claim 1 wherein the pulse counting circuitry of said timer circuitry generates a timer interrupt signal after counting to its full capacity and upon restarting, and wherein said timer interrupt signal is transmitted to increment the microprocessor counter circuit.

3. The external pulse width measuring circuitry claimed in claim 2 wherein the pulse width of an external pulse is determined by said microprocessor by summing the pulse count transferred by said timing circuitry with the count registered by the microprocessor counter circuit.

4. The external pulse width measuring circuitry claimed in claim 2 wherein said pulse counting circuitry of said timer includes means for preloading a count predetermined by said microprocessor and applied to said pulse counting circuitry through said data bus on the occurrence of a particular second output signal generated by said control circuitry.

5. The external pulse width measuring circuitry claimed in claim 2 wherein said pulse counting circuitry of said timer is a binary counter incremented by the occurrence of each counting pulse generated by said prescaler whereby, upon occurrence of a signal representing an end-of-pulse transition of the external pulse, said prescaler counting pulses will terminate to stop the incrementing of said timer pulse counter.

6. The external pulse width measuring circuitry claimed in claim 2 wherein said prescaler and timer control circuitry includes circuitry for enabling said prescaler upon a negative going leading edge of said external pulse.

7. The external pulse width measuring circuitry claimed in claim 2 wherein said prescaler and timer control circuitry includes circuitry for enabling said prescaler upon a positive going leading edge of said external pulse.

* * * * *